(12) United States Patent
Hayashi et al.

(10) Patent No.: US 10,943,859 B2
(45) Date of Patent: Mar. 9, 2021

(54) SEMICONDUCTOR DEVICE

(71) Applicant: DENSO CORPORATION, Kariya (JP)

(72) Inventors: Eiji Hayashi, Kariya (JP); Ryoji Uwataki, Kariya (JP); Tomomi Okumura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/527,543

(22) Filed: Jul. 31, 2019

(65) Prior Publication Data
US 2019/0355656 A1    Nov. 21, 2019

Related U.S. Application Data

(63) Continuation of application No. PCT/JP2018/003734, filed on Feb. 5, 2018.

(30) Foreign Application Priority Data

Mar. 22, 2017  (JP) .............................. JP2017-056316
Jun. 14, 2017  (JP) .............................. JP2017-117217

(51) Int. Cl.
*H01L 23/498*    (2006.01)
*H01L 21/56*     (2006.01)
*H01L 23/12*     (2006.01)
*H01L 23/28*     (2006.01)
*H01L 23/40*     (2006.01)
(Continued)

(52) U.S. Cl.
CPC ........ *H01L 23/49838* (2013.01); *H01L 21/56* (2013.01); *H01L 23/12* (2013.01); *H01L 23/28* (2013.01); *H01L 23/40* (2013.01); *H01L 23/49541* (2013.01); *H01L 23/49568* (2013.01); *H01L 24/27* (2013.01); *H01L 24/33* (2013.01); *H01L 24/73* (2013.01); *H01L 2224/26175* (2013.01); *H01L 2224/27013* (2013.01); *H01L 2224/291* (2013.01); *H01L 2224/33* (2013.01); *H01L 2924/181* (2013.01); *H01L 2924/351* (2013.01)

(58) Field of Classification Search
CPC ... H01L 21/56; H01L 23/40; H01L 23/49568; H01L 23/3121; H01L 23/3142; H01L 23/4334
See application file for complete search history.

(56) References Cited

U.S. PATENT DOCUMENTS 6,703,707 B1    3/2004   Mamitsu et al.
2015/0187671 A1 7/2015   Fukuda et al.
2015/0294927 A1 10/2015  Yamashita et al.
(Continued)

FOREIGN PATENT DOCUMENTS

JP    2002-231883 A    8/2002
JP    2005-311019 A    11/2005
JP    2018-160653 A    10/2018

*Primary Examiner* — Mohammed R Alam
(74) *Attorney, Agent, or Firm* — Posz Law Group, PLC

(57) ABSTRACT

The present disclosure describes a semiconductor device including: a semiconductor chip having an electrode; a conductive member including a metal base and having a mounting portion and a peripheral portion surrounding the mounting portion; a solder that is provided between the electrode and the mounting portion; and a sealing resin body that integrally seals the semiconductor chip, at least the face opposed to the electrode in the conductive member, and the solder.

30 Claims, 10 Drawing Sheets

(51) Int. Cl.
*H01L 23/495* (2006.01)
*H01L 23/00* (2006.01)

(56) References Cited

U.S. PATENT DOCUMENTS

| | | |
|---|---|---|
| 2017/0278774 A1 | 9/2017 | Hayashi et al. |
| 2018/0190608 A1* | 7/2018 | Gupta ................ H01L 21/4825 |
| 2019/0206757 A1* | 7/2019 | Hayashida ............ H01L 23/488 |

* cited by examiner

SEMICONDUCTOR DEVICE

CROSS-REFERENCE TO RELATED APPLICATIONS

The present application is a continuation application of international Patent Application No. PCT/JP2018/003734 filed on Feb. 5, 2018, which designated the U.S. and claims the benefit of priority from Japanese Patent Application No. 2017-56316 filed on Mar. 22, 2017 and Japanese Patent Application No. 2017-117217 filed on Jun. 14, 2017. The entire disclosures of all of the above applications are incorporated herein by reference.

TECHNICAL FIELD

The present disclosure relates a semiconductor device.

BACKGROUND

In a semiconductor device, an electrode of a semiconductor chip and a conductive member are connected by solder and integrally sealed with a sealing resin body.

SUMMARY

The present disclosure describes a semiconductor device including: a semiconductor chip having an electrode; a conductive member including a metal base and having a mounting portion and a peripheral portion surrounding the mounting portion; a solder that is provided between the electrode and the mounting portion; and a sealing resin body that integrally seals the semiconductor chip, at least the face opposed to the electrode in the conductive member, and the solder.

BRIEF DESCRIPTION OF DRAWINGS

Features and advantages of the present disclosure will become more apparent from the following detailed description with reference to the accompanying drawings. In the drawings.

DETAILED DESCRIPTION

Figure 1:
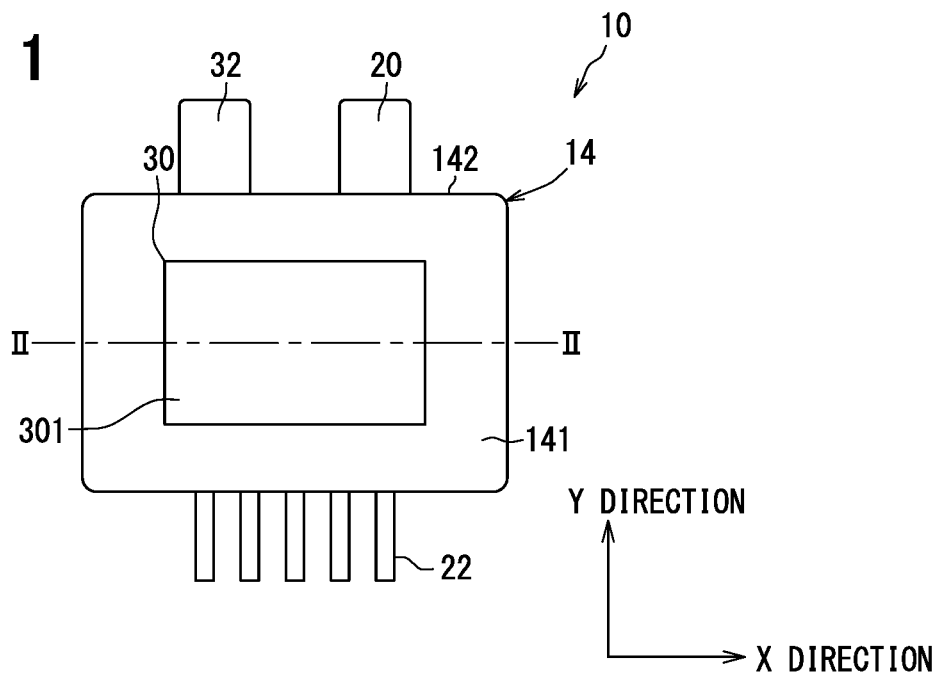
FIG. 1 is a plan view of a schematic structure of a semiconductor device according to a first embodiment.

An electrode of a semiconductor chip and a conductive member In a semiconductor device are connected by solder. A sealing resin body integrally seals. The conductive member includes, on a face opposed to the electrode, a mounting portion to which the semiconductor chip is mounted by use of the solder and a peripheral portion surrounding the mounting portion. An adhesive portion to which the sealing resin body adheres is provided to the peripheral portion.

In the structure in which the entire peripheral portion is formed as the adhesive portion, the adhesive portion is adjacent to the mounting portion, i.e., the solder. The inventors of the present application found the following. In a configuration of a related art, thermal stress in a shear direction increases in an interface between an end of the adhesive portion near the solder and the sealing resin body. As a result, the sealing resin body may separate from the adhesive portion that is provided to suppress separation of the sealing resin body.

The present disclosure may provide a semiconductor device in which separation of a sealing resin body from a conductive member can be suppressed.

According to one aspect of the present disclosure, a semiconductor device may include: a semiconductor chip having an electrode; a conductive member including a metal base and having, on a face opposed to the electrode, a mounting portion for the semiconductor chip and a peripheral portion surrounding the mounting portion; a solder that is provided between the electrode and the mounting portion to connect the electrode and the conductive member; and a sealing resin body that integrally seals the semiconductor chip, at least the face opposed to the electrode in the conductive member, and the solder. The conductive member has, as the peripheral portion, an adhesive portion and a non-adhesive portion. The sealing resin body adheres to the adhesive portion. The non-adhesive portion is placed between the mounting portion and the adhesive portion. The solder does not connect with the non-adhesive portion. The non-adhesive portion has lower adhesion to the sealing resin body than the adhesive portion.

According to the semiconductor device, the non-adhesive portion to which the solder is not connected and the sealing resin body does not adhere is provided between the mounting portion and the adhesive portion. In this way, the mounting portion, i.e., the solder is not adjacent to the adhesive portion. Therefore, it may be possible to reduce thermal stress in a shear direction and acting on an interface between an end of the adhesive portion near the solder and the sealing resin body to thereby suppress the separation of the sealing resin body from the adhesive portion.

With reference to the drawings, multiple embodiments will be described. In the multiple embodiments, portions functionally and/or structurally corresponding to each other will be provided with the same reference signs. In the following description, a thickness direction of a semiconductor board is given as a Z direction and a direction orthogonal to the Z direction is given as an X direction. A direction orthogonal to both of the Z direction and the X direction is given as a Y direction. Unless otherwise specified, a shape conforming to an X-Y plane defined by the X direction and Y direction is given as a planer shape.

First Embodiment

Based on FIGS. 1 to 3, a schematic structure of a semiconductor device will be described.

Figure 2:
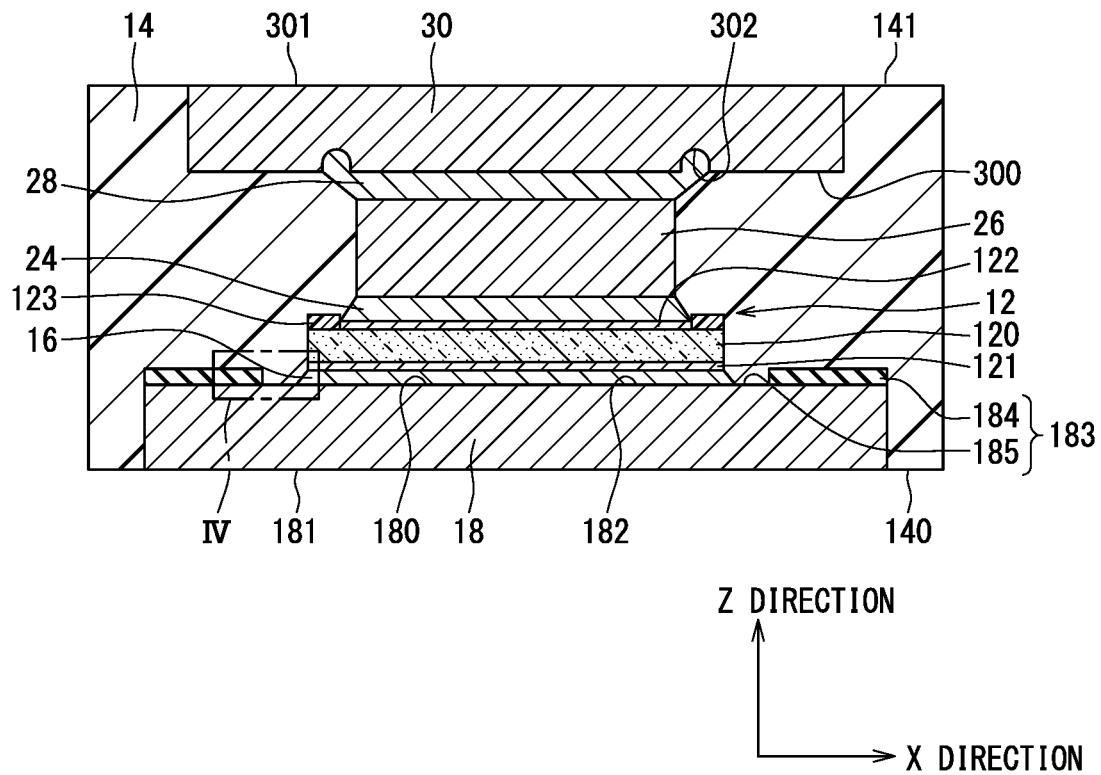
FIG. 2 is a sectional view along line II-II in FIG. 1.
Figure 3:
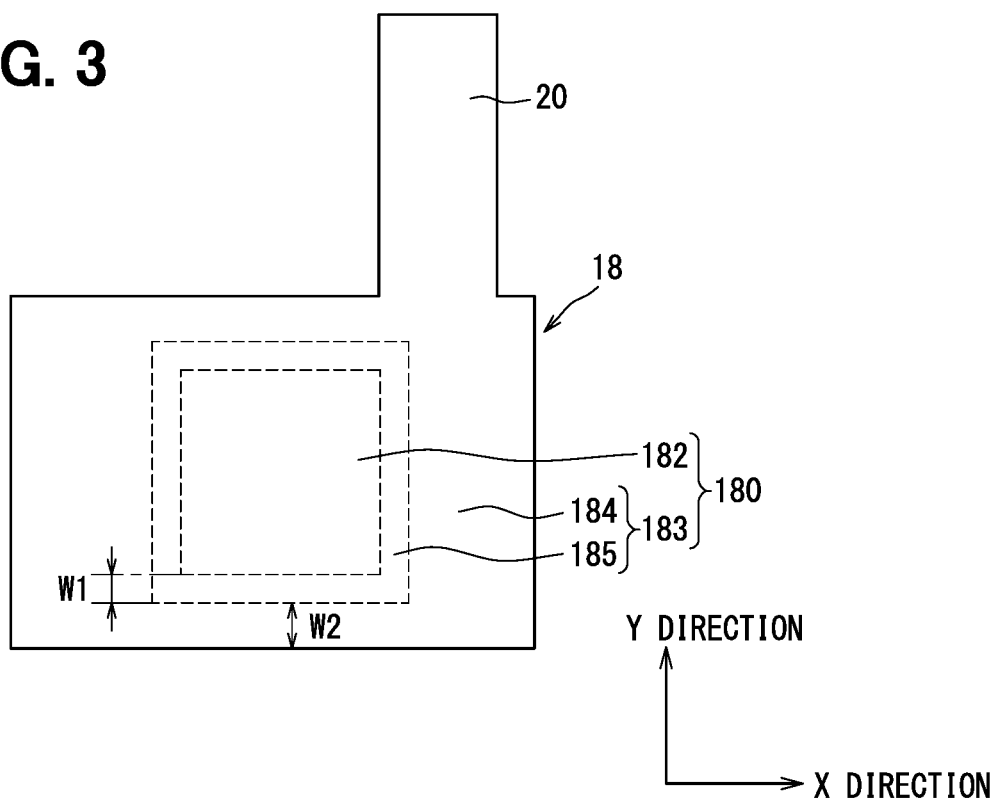
FIG. 3 is a plan view of a first heat sink seen from a side of an opposed face.

As shown in FIGS. 1 and 2, the semiconductor device 10 includes a semiconductor chip 12, a sealing resin body 14, a first heat sink 18, a main terminal 20, a signal terminal 22, a terminal 26, a second heat sink 30, and a main terminal 32. The semiconductor device 10 is applied to a three-phase inverter forming a vehicle-mounted power converter, for example. The semiconductor device 10 forms one of six arms forming the three-phase inverter.

The semiconductor chip 12 is formed by forming elements such as an insulated gate bipolar transistor (IGBT) on a semiconductor board 120 made of silicon, silicon carbide, or the like. In the present embodiment, the n-channel IGBT is formed and a freewheeling diode (FWD) connected in anti-parallel with the IGBT is formed as well. In other words, the RC (Reverse-Conducting) IGBT is formed on the semiconductor board 120. The semiconductor board 120 has a substantially rectangular shape in a plan view.

Each of the IGBT and the FWD has a vertical structure, so that a current flows in the Z direction that is a thickness direction of the semiconductor board 120. Main electrodes are respectively formed on opposite faces in the Z direction of the semiconductor board 120. As the main electrodes, the collector electrode 121 is formed on the one face and the emitter electrode 122 is formed on the back face opposite from the one face. The collector electrode 121 corresponds to an electrode. The one face may be referred to as "front face" or "first face". The back face may be referred to as "second face".

In the present embodiment, the collector electrode 121 also serves as a cathode electrode of the FWD. The emitter electrode 122 also serves as an anode electrode of the FWD. The collector electrode 121 is formed on the entire back face of the semiconductor board 120. A protective film 123 made of polyimide or the like is formed on the one face of the semiconductor board 120 and the emitter electrode 122 is exposed from the protective film 123. In other words, the emitter electrode 122 is formed on a part of the one face of the semiconductor board 120. Signal pads (not shown) are also exposed from the protective film 123. The signal pads include a pad for a gate electrode.

The sealing resin body 14 integrally seals the semiconductor chip 12 and component elements of the semiconductor device 10 other than the semiconductor chip 12. The sealing resin body 14 is a resin molding. The sealing resin body 14 is formed by using epoxy-based resin, for example. In the present embodiment, the sealing resin body 14 is formed by a transfer molding method.

The sealing resin body 14 has a substantially rectangular shape in a plan view. The sealing resin body 14 has one face 140 that is a face on one side and a back face 141 on an opposite side from the one face 140 as surfaces in the Z direction. The one face 140 and the back face 141 are substantially flat faces. The sealing resin body 14 has side faces 142 as parts of the surfaces. The side faces 142 are continuous with the one face 140 and the back face 141.

The first heat sink 18 is connected to the collector electrode 121 of the semiconductor chip 12 by solder 16. The first heat sink 18 corresponds to a conductive member. The first heat sink 18 dissipates heat, generated by the semiconductor chip 12, to an outside of the semiconductor device 10. The first heat sink 18 serves as an electrical relay between the semiconductor chip 12 and the main terminal 20.

The first heat sink 18 has an opposed face 180 opposed to the collector electrode 121 and a back face 181 opposite from the opposed face 180 as surfaces in the Z direction. As shown in FIGS. 2 and 3, the first heat sink 18 has a mounting portion 182 and a peripheral portion 183 on the opposed face 180. The mounting portion 182 is a portion of the opposed face 180, to which the solder 16 is connected, i.e., a portion where the semiconductor chip 12 is mounted. The mounting portion 182 includes at least a portion overlapping the collector electrode 121 (semiconductor chip 12) in the plan view in the Z direction. The peripheral portion 183 is a portion of the opposed face 180 other than the mounting portion 182. The peripheral portion 183 surrounds the mounting portion 182.

The peripheral portion 183 has an adhesive portion 184 to which the sealing resin body 14 adheres, and a non-adhesive portion 185 to which the sealing resin body 14 does not adhere. The adhesive portion 184 surrounds the mounting portion 182 at a position away from the mounting portion 182 so as not to be adjacent to the mounting portion 182. The portion between the mounting portion 182 and the adhesive portion 184 is formed as the non-adhesive portion 185. The non-adhesive portion 185 is adjacent to the mounting portion 182 and surrounds the mounting portion 182. In the present embodiment, the adhesive portion 184 is formed by a roughening treatment. In other words, the adhesive portion 184 is formed by a roughened portion. The entire portion from an outside of the non-adhesive portion 185 to an outer peripheral edge of the opposed face 180 is formed as the adhesive portion 184. A width of the non-adhesive portion 185 is substantially constant throughout a periphery.

The non-adhesive portion 185 has lower adhesion to the sealing resin body 14 than the adhesive portion 184. As a result, the sealing resin body 14 does not adhere to the non-adhesive portion 185 and adheres only to the adhesive portion 184. The sealing resin body 14 is intentionally separated from the non-adhesive portion 185. The first heat sink 18 including the peripheral portion 183 will be described later.

The back face 181 of the first heat sink 18 is exposed from the sealing resin body 14. The back face 181 is exposed to be substantially flush with the one face 140. In this manner, the back face 181 serves as a heat dissipating face for dissipating the heat to the outside of the semiconductor device 10. The surface other than the back face 181, i.e., the opposed face 180 is covered with the sealing resin body 14.

The main terminal 20 is connected to the first heat sink 18. The main terminal 20 is electrically connected to the collector electrode 121 via the first heat sink 18. The main terminal 20 is formed to extend in the Y direction from the first heat sink 18 and protrudes outward from one of the side faces 142 of the sealing resin body 14. The main terminal 20 may be formed integrally with the first heat sink 18 as a part of a lead frame or formed as a separate member and connected to the first heat sink 18. In the present embodiment, the main terminal 20 is integrally formed with the first heat sink 18. The main terminal 20 has a smaller thickness than the first heat sink 18. The main terminal 20 is connected to the opposed face 180 of the first heat sink 18 to be substantially flush with the opposed face 180.

The signal terminals 22 are electrically connected to the pads of the semiconductor chip 12 by bonding wires (not shown). As shown in FIG. 1, the signal terminals 22 are formed to extend in the Y direction. The signal terminals 22 protrude outward from the face opposite from the side face 142 from which the main terminal 20 protrudes.

The terminal 26 is connected to the emitter electrode 122 of the semiconductor chip 12 by solder 24. The terminal 26 is provided between the semiconductor chip 12 and the second heat sink 30. The terminal 26 has a function of a spacer for securing heights of the bonding wires. Therefore, the terminal 26 may be unnecessary. For example, the second heat sink 30 may be provided with a protrusion having the function of the spacer.

The terminal 26 includes a metal base made of Cu or the like. The terminal 26 serves as an electrical relay between the emitter electrode 122 of the semiconductor chip 12 and the second heat sink 30. Heat generated by the semiconductor chip 12 is transferred to the second heat sink 30 via the terminal 26.

The second heat sink 30 is connected to a face of the terminal 26 opposite from the semiconductor chip 12 by solder 28. The second heat sink 30 dissipates heat, generated by the semiconductor chip 12, to an outside of the semiconductor device 10. The second heat sink 30 serves as an electrical relay between the semiconductor chip 12 and the main terminal 32. The second heat sink 30 includes a metal base made of Cu or the like.

The second heat sink 30 has an opposed face 300 opposed to the terminal 26 and a back face 301 opposite from the opposed face 300 as surfaces in the Z direction. The second heat sink 30 has a groove 302, which houses the solder 28 which has been spilled, in the opposed face 300. By housing the spilling solder 28 in the groove 302, it is possible to restrain the solder 28 from wetting and spreading toward the semiconductor chip 12 along side faces of the terminal 26.

The back face 301 of the second heat sink 30 is exposed from the sealing resin body 14. The back face 301 is exposed to be substantially flush with the back face 141. In this manner, the back face 301 serves as a heat dissipating face for dissipating the heat to the outside of the semiconductor device 10. The surface other than the back face 301, i.e., the opposed face 300 is covered with the sealing resin body 14.

The main terminal 32 is connected to the second heat sink 30. The main terminal 32 is electrically connected to the emitter electrode 122 via the second heat sink 30. The main terminal 32 is formed on the same side as the main terminal 20 to extend in the Y direction from the second heat sink 30. The main terminal 32 protrudes outward from the same side face 142 as the main terminal 20. The main terminal 32 may be formed integrally with the second heat sink 30 as a part of a lead frame or formed as a separate member and connected to the second heat sink 30. In the present embodiment, the main terminal 32 is integrally formed with the second heat sink 30. The main terminal 32 has a smaller thickness than the second heat sink 30. The main terminal 32 is connected to the opposed face 300 of the second heat sink 30 to be substantially flush with the opposed face 300.

In the semiconductor device 10 formed as described above, the sealing resin body 14 integrally seals the semiconductor chip 12, the part of the first heat sink 18, parts of the main terminals 20, 32, parts of the signal terminals 22, the terminal 26, and the part of the second heat sink 30. In the semiconductor device 10, the semiconductor chip 12 forming the one arm is sealed with the sealing resin body 14. Therefore, the semiconductor device 10 is also referred to as "1-in-1 package".

The first heat sink 18 and the second heat sink 30 are machined together with the sealing resin body 14. Therefore, the one face 140 and the back face 181 are machined faces and substantially flush with each other. Similarly, the back face 141 and the back face 301 are machined faces and substantially flush with each other. In this manner, the semiconductor device 10 has a double-sided heat dissipation structure with both of the back faces 181, 301 exposed from the sealing resin body 14.

As each of the solder 16, 24, 28, fluxless solder is used. The one face 140 and the back face 181 are not restricted to the machined faces. The back face 141 and the back face 301 are not restricted to the machined faces. By bringing the back faces 181, 301 in contact with wall faces of a mold for the sealing resin body 14, it is possible to make the back faces 181, 301 exposed from the sealing resin body 14 without machining.

A structure of the first heat sink 18 will be described based on FIG. 4.

Figure 4:
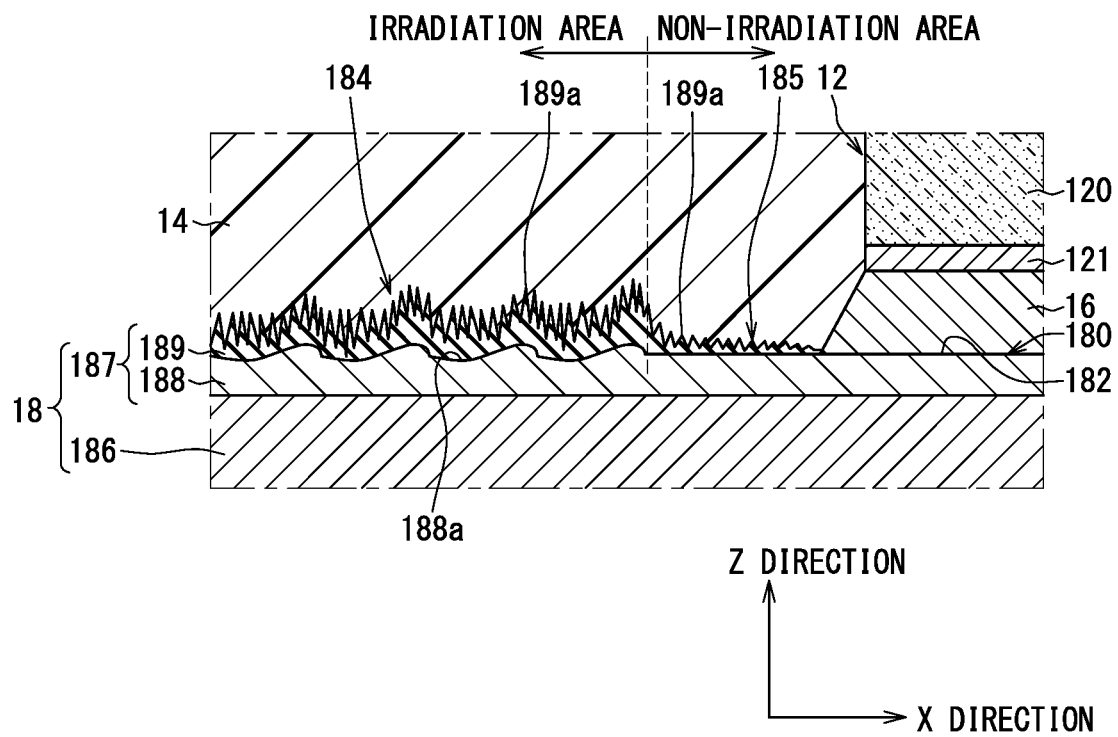
FIG. 4 is an enlarged sectional view of area IV shown by a one-dot chain line in FIG. 2.

As shown in FIG. 4, the first heat sink 18 has a base 186 made of metal material such as Cu, and a film 187 provided at least on a side of the opposed face 180 of a surface of the base 186. The base 186 corresponds to a metal base. The base 186 has a substantially rectangular parallelepiped shape. The film 187 includes a metal thin film 188 formed on the surface of the base 186 and an uneven oxide film 189 that is an oxide of metal and has a continuously uneven surface, the metal being a main component of the metal thin film 188.

In the present embodiment, the metal thin film 188 includes Ni as the main component. The metal thin film 188 is formed by plating, vapor deposition, or the like, for example. The metal thin film 188 is formed on the surface of the base 186 by electroless Ni plating, for example. The metal thin film 188 includes P (phosphorus) besides Ni that is the main component.

The metal thin film 188 is formed on a portion of the surface of the base 186 excluding the back face 181. On the side of the opposed face 180, multiple recesses 188*a* are formed at a portion of a surface of the metal thin film 188 corresponding to the adhesive portion 184. In other words, recesses 188*a* are not formed at the mounting portion 182 and the non-adhesive portion 185. At the portion without the recesses 188*a*, the metal thin film 188 has a film thickness of about 10 μm, for example. In other words, the film thickness before application of a laser beam is about 10 μm.

The recesses 188*a* are formed by the application of the pulsed laser beam. One pulse forms each of the recesses 188*a*. The adjacent recesses 188*a* are formed continuously in a scanning direction of the laser beam. The multiple recesses 188*a* are continuous in the X direction and in the Y direction as well. At the adhesive portion 184, the surface of the metal thin film 188 has a scale-like (scaly) structure formed by the multiple recesses 188*a*. The portion corresponding to the adhesive portion 184 is an irradiated area with the laser beam and the portion corresponding to the mounting portion 182 and the non-adhesive portion 185 is an unirradiated area.

Each of the recesses 188*a* has a width of 5 μm to 300 μm. Each of the recesses 188*a* has a depth of 0.5 μm to 5 μm. If the depth of the recess 188a is smaller than 0.5 µm, melting and the vapor deposition of the surface of the metal thin film 188 by the application of the laser beam may be insufficient, which makes formation of the uneven oxide film 189 difficult. If the depth of the recess 188a is larger than 5 µm, the surface of the metal thin film 188 is liable to melt and spatter and the melting and spattering become dominant over the vapor deposition in forming the surface, which makes the formation of the uneven oxide film 189 difficult.

The uneven oxide film 189 is formed on the metal thin film 188 on the side of the opposed face 180. The uneven oxide film 189 is not formed at the mounting portion 182. The uneven oxide film 189 is formed at the peripheral portion 183, i.e., the adhesive portion 184 and the non-adhesive portion 185. The uneven oxide film 189 is formed by oxidizing the metal forming the metal thin film 188 by applying the laser beam to the metal thin film 188. The uneven oxide film 189 is the film of the oxide formed on the surface of the metal thin film 188 by oxidizing the surface of the metal thin film 188. The uneven oxide film 189 can be also referred to as "laser irradiated film", since the uneven oxide film 189 is formed by the application of the laser beam.

In the present embodiment, $Ni_2O_3$, NiO, and Ni constitute 80%, 10%, and 10%, respectively, of the uneven oxide film 189. The main component of the uneven oxide film 189 is the oxide of Ni which is the main component of the metal thin film 188.

An average film thickness of the uneven oxide film 189 at the adhesive portion 184, i.e., in the irradiated area with the laser beam is 10 nm to hundreds of nanometers. The uneven oxide film 189 is formed to conform to the recessed and protruding surface of the metal thin film 188 having the recesses 188a. On a surface of the uneven oxide film 189, recesses and protrusions are formed with a smaller pitch than widths of the recesses 188a. In other words, the extremely fine recesses and protrusions (corresponding to a roughened portion) are formed. In other words, the multiple protrusions 189a (corresponding to columnar bodies) are formed with the small pitch. For example, an average width of the protrusion 189a is 1 nm to 300 nm and an average interval between the protrusions 189a is 1 nm to 300 nm. An average height of the protrusion 189a is 10 nm to hundred nanometers.

In this manner, the adhesive portion 184 is formed by the uneven oxide film 189 having the extremely fine recesses and protrusions formed on the surface. An anchoring effect is exerted by the sealing resin body 14 that clings to the protrusions 189a on the surface of the uneven oxide film 189. Moreover, since the protrusions 189a are higher than at the non-adhesive portion 185, an area of contact with the sealing resin body 14 is larger. Therefore, the sealing resin body 14 adheres to the adhesive portion 184 of the opposed face 180.

The uneven oxide film 189 is formed by the melting and the vapor deposition of the surface of the metal thin film 188 by the application of the laser beam to the metal thin film 188. The uneven oxide film 189 is formed not only at the adhesive portion 184, which is the irradiated area with the laser beam, but also at a periphery of the adhesive portion 184. In the present embodiment, the uneven oxide film 189 is formed throughout the non-adhesive portion 185 and not formed in the mounting portion 182 in the unirradiated area with the laser beam. A width W1 (see FIG. 3) of the non-adhesive portion 185 throughout which the uneven oxide film 189 is formed is 0.2 mm to 0.3 mm.

The laser beam is not directly applied and therefore an average film thickness of the uneven oxide film 189 at the non-adhesive portion 185 is smaller than the average film thickness of the uneven oxide film 189 at the adhesive portion 184 and larger than a natural oxide film. Specifically, the average film thickness is 0.1 nm to 10 nm. Heights of the protrusions 189a on the surface of the uneven oxide film 189 are smaller than at the adhesive portion 184. Specifically, the average film thickness is 0.1 nm to 10 nm. The average width of the protrusion 189a and the average interval between the protrusions 189a are about the same as at the adhesive portion 184.

By having the uneven oxide film 189, the non-adhesive portion 185 has lower adhesion to the sealing resin body 14 than the adhesive portion 184. In this way, the sealing resin body 14 does not adhere to the non-adhesive portion 185. In this manner, the sealing resin body 14 is intentionally separated from the non-adhesive portion 185. Moreover, by having the uneven oxide film 189, the non-adhesive portion 185 has lower wettability by the solder 16 than the mounting portion 182. In other words, the solder 16 is less likely to wet and spread toward the non-adhesive portion 185 from the mounting portion 182. As a result, the solder 16 is not connected to the non-adhesive portion 185.

In forming the semiconductor device 10, the uneven oxide film 189 is formed in advance on the first heat sink 18 before performing reflow of the solder 16, 24, and 28. To form the uneven oxide film 189, the pulsed laser beam is applied to the area, where the adhesive portion 184 is to be formed, out of the surface of the metal thin film 188 on the side of the opposed face 180 of the first heat sink 18. Scanning with the laser beam is performed in the X direction so that adjacent spots (irradiated areas by one pulse) of the laser beam partially overlap each other in the X direction. Scanning with the laser beam is performed in the Y direction so that adjacent spots of the laser beam partially overlap each other in the Y direction. In this manner, the entire area where the adhesive portion 184 is to be formed is irradiated with the laser beam.

By the application of the laser beam, the surface of the metal thin film 188 melts and vaporizes to form the multiple recesses 188a. The melting and vaporizing metal thin film 188 is vapor-deposited on the portion irradiated with the laser beam (i.e., the area where the adhesive portion 184 is to be formed) and the periphery of the portion irradiated with the laser beam (i.e., an area where the non-adhesive portion 185 is to be formed). In this way, the uneven oxide film 189 that is thicker at the adhesive portion 184 and thinner at the non-adhesive portion 185 is formed. The uneven oxide film 189 having the higher protrusions 189a at the adhesive portion 184 and the lower protrusions 189a at the non-adhesive portion 185 is formed.

At the mounting portion 182, the uneven oxide film 189 is not formed on the surface of the metal thin film 188 and a natural oxide film (not shown) is formed. Since the natural oxide film is thinner than the uneven oxide film 189 at the non-adhesive portion 185, the natural oxide film is reduced and removed during the reflow of the solder 16, e.g., reduced-pressure reflow under a hydrogen atmosphere.

It is possible to perform the reflow of the solder 16, 24, 28 by using a known method. Description in JP 2016-197706 A may be incorporated if necessary.

An example of effects of the semiconductor device 10 will be described. The inventors of the present application found the following fact. If the adhesive portion is adjacent to the mounting portion, i.e., if the adhesive portion is adjacent to the solder on the opposed face of the first heat sink, thermal stress in a shear direction increases in an interface between an end of the adhesive portion near the solder and the sealing resin body. As a result, the sealing resin body may separate from the adhesive portion that is provided to suppress separation of the sealing resin body.

In the semiconductor device 10 in the present embodiment, the non-adhesive portion 185 to which the solder 16 is not connected and the sealing resin body 14 does not adhere is provided between the mounting portion 182 to which the solder 16 is connected and the adhesive portion 184 to which the sealing resin body 14 adheres on the opposed face 180 of the first heat sink 18. Since the non-adhesive portion 185 is provided, the mounting portion 182, i.e., the solder 16 is not adjacent to the adhesive portion 184. Therefore, it is possible to reduce the thermal stress in the shear direction and acting on the interface between the end of the adhesive portion 184 near the solder 16 and the sealing resin body 14. In other words, it is possible to suppress separation of the sealing resin body 14 from the adhesive portion 184.

Figure 5:
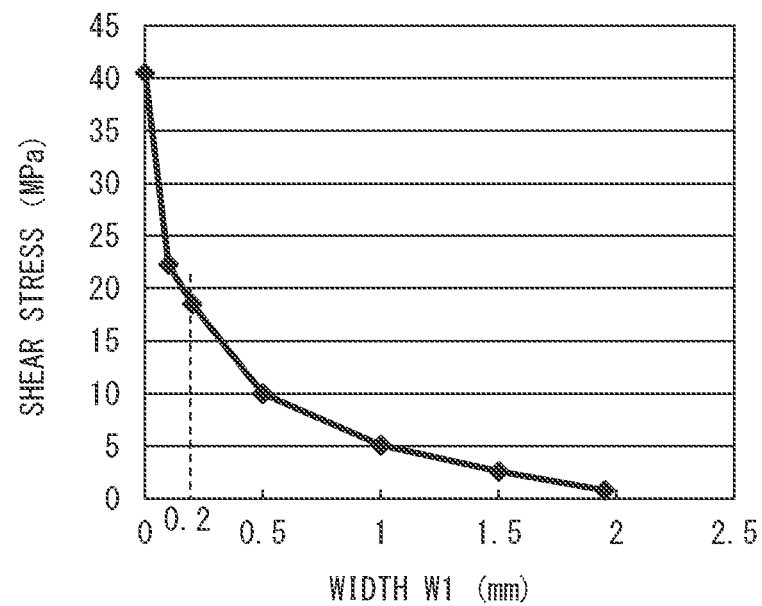
FIG. 5 is a diagram showing a relationship between a width of a non-adhesive portion and shear stress acting on an end of an adhesive portion.

FIG. 5 shows results of simulations about a relationship between the width W1 of the non-adhesive portion 185 and the thermal stress in the shear direction (hereinafter referred to as "shear stress") acting on the interface between the end of the adhesive portion 184 near the solder 16 and the sealing resin body 14. In the simulations, a thickness of the semiconductor board 120, i.e., the element was 105 μm, size of the element was 13.4 mm×15 mm, a thickness of the solder 16 was 40 μm, and a thickness of the solder 24 was 150 μm. A temperature of the sealing resin body 14 was changed from 180° C. to −40° C. and the shear stress at −40° C. was obtained.

As shown in FIG. 5, the shear stress was 40.5 MPa when the width W1 of the non-adhesive portion 185 was 0 mm, i.e., when the adhesive portion 184 was adjacent to the mounting portion 182 and the shear stress was 22.3 MPa when the width W1 was 0.1 mm. The shear stress was 18.5 MPa when the width W1 was 0.2 mm, the shear stress was 10.0 MPa when the width W1 was 0.5 mm, and the shear stress was 5.1 MPa when the width W1 was 1.0 mm. Furthermore, the shear stress was 2.6 MPa when the width W1 was 1.5 mm and the shear stress was 0.8 MPa when the width W1 was 1.95 mm.

From the results of the simulations, the shear stress may be reduced when the non-adhesive portion 185 is provided as compared with the structure in which the adhesive portion 184 is adjacent to the mounting portion 182.

Specifically, in the present embodiment, the width W1 of the non-adhesive portion 185 is 0.2 mm to 0.3 mm. As shown in FIG. 5, it is possible to limit the shear stress to 20 MPa or less by setting the width W1 to 0.2 mm or more. The heating/cooling tests confirmed that the shear stress limited to 20 MPa or less effectively suppressed separation of the sealing resin body 14 from the adhesive portion 184. Since the width W1 is 0.2 mm or more in the present embodiment, it is possible to effectively suppress the separation of the sealing resin body 14 from the adhesive portion 184.

Figure 6:
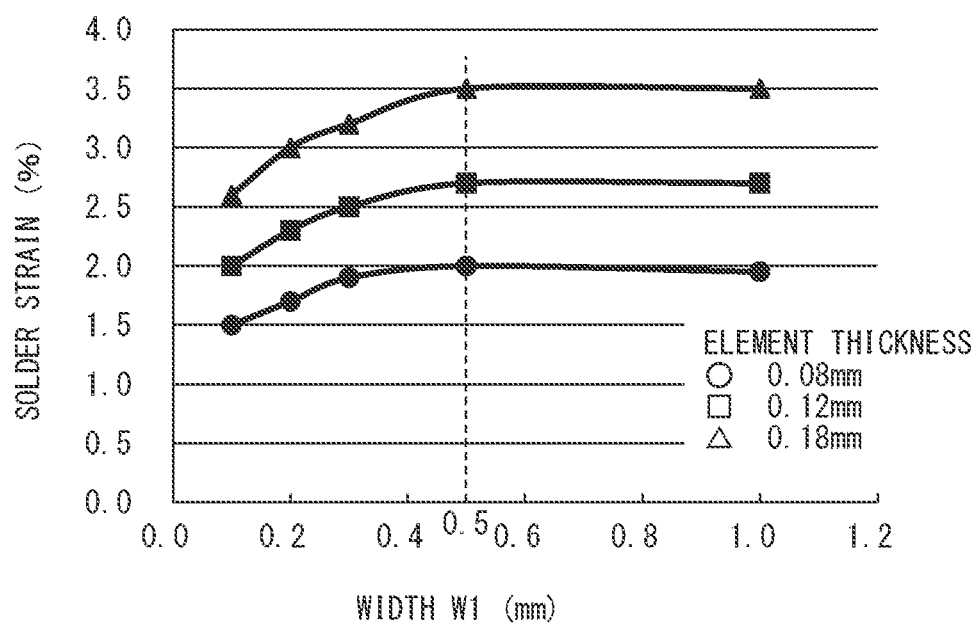
FIG. 6 is a diagram showing a relationship between the width of the non-adhesive portion and a solder strain for each element thickness.

FIG. 6 shows results of simulations about a relationship between the width W1 of the non-adhesive portion 185 and a strain (plastic strain) of the solder 16 due to the thermal stress. In the simulations, size of the element was 13.4 mm×15 mm, a thickness of the solder 16 was 40 μm, and a thickness of the solder 24 was 40 μm. Three levels of element thicknesses, i.e., 0.08 mm (80 μm), 0.12 mm, and 0.18 mm were used as shown in FIG. 6. As shown in FIG. 6, circles, squares, and triangles correspond to the element thicknesses of 0.08 mm, 0.12 mm, 0.18 mm, respectively.

The temperature of the sealing resin body 14 was changed from 180° C. to −40° C. and a solder strain (%) was obtained from a displacement of the solder 16 at −40° C. from the solder 16 at 180° C.

From FIG. 6, the solder strain may be reduced by limiting the width W1 to 0.5 mm or less for every element thickness. In the present embodiment, the width W1 is 0.2 mm to 0.3 mm and therefore it is possible to reduce the solder stress, i.e., the thermal stress acting on the solder 16 irrespective of the element thickness. In other words, it is possible to increase connection reliability of the solder 16 irrespective of the element thickness. According to the present embodiment, it is possible to increase the connection reliability of the solder 16 while effectively suppressing the separation of the sealing resin body 14 from the adhesive portion 184.

Moreover, in the present embodiment, the uneven oxide film 189 having the fine recesses and protrusions is formed on the opposed face 180 of the first heat sink 18 by the application of the laser beam. The laser beam is applied and the portion with the higher protrusions 189a, i.e., the portion with the thicker uneven oxide film 189 serves as the adhesive portion 184. Since the portion roughened by the application of the laser beam is used as the adhesive portion 184, it is easy to locally form the adhesive portion 184.

The peripheral portion of the adhesive portion 184 with the lower protrusions 189a, i.e., the portion with the thinner uneven oxide film 189 serves as the non-adhesive portion 185. In this manner, the uneven oxide film 189 is formed throughout the area where the non-adhesive portion 185 is to be formed. The fine recesses and protrusions are formed on the surface of the uneven oxide film 189 and the non-adhesive portion 185 has lower wettability by the solder 16 than the mounting portion 182. Therefore, it is possible to allow the solder 16 to wet and spread in the area on the inner side of the uneven oxide film 189, i.e., on the inner side of the non-adhesive portion 185 only. Therefore, it is easy to define the mounting portion 182. In other words, it is easy to obtain the non-adhesive portion 185 having the desired width W1.

Figure 7:
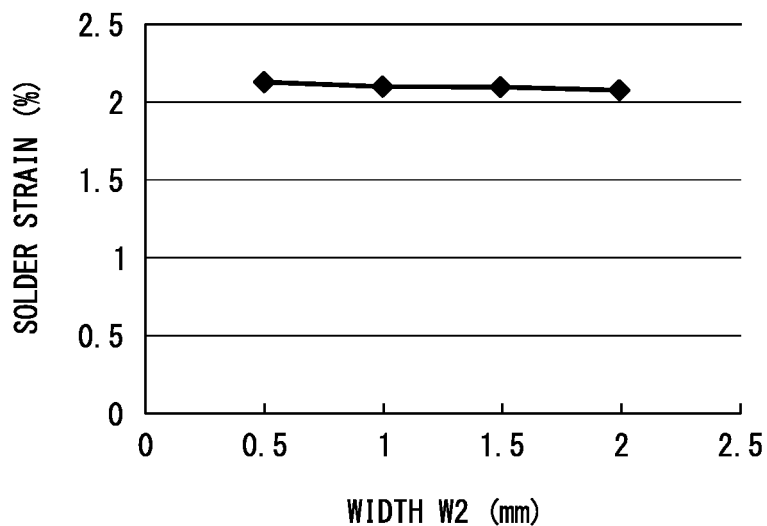
FIG. 7 is a diagram showing a relationship between a width of the adhesive portion and the solder strain.

FIG. 7 shows results of simulations about a relationship between a minimum value W2 of the width of the adhesive portion 184 (hereinafter merely referred to as "width W2 of the adhesive portion 184") and a strain (plastic strain) of the solder 16 due to the thermal stress. In the simulations, a thickness of the element was 105 μm, the size of the element was 13.4 mm×15 mm, the thickness of the solder 16 was 40 μm, the thickness of the solder 24 was 150 μm, and the width W1 of the non-adhesive portion 185 was 0.65 mm. Three cycles of change from 180° C. to −40° C. of the temperature of the sealing resin body 14 were performed and the solder strain (%) was obtained. From FIG. 7, it is clear that the value of the solder strain stays substantially constant when the width W2 is changed to 0.5 mm, 1.0 mm, 1.5 mm, and 2.0 mm.

Figure 8:
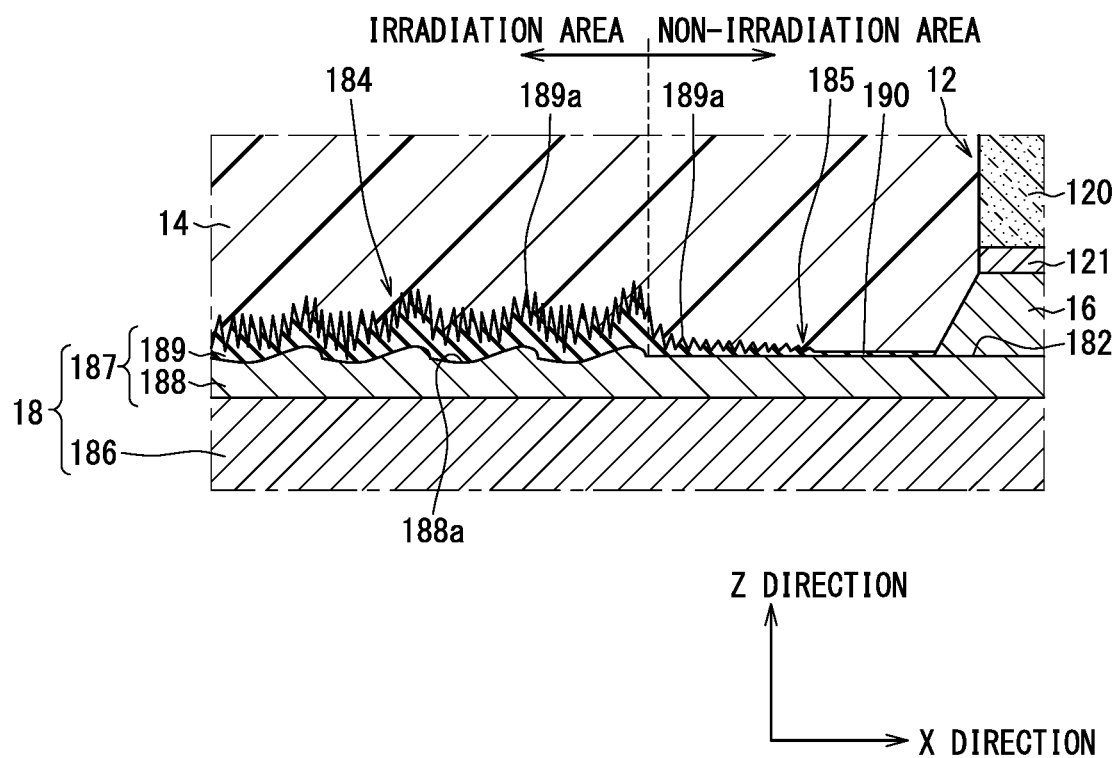
FIG. 8 is a sectional view of a first modification and corresponding to FIG. 3.

In the example shown in the present embodiment, the uneven oxide film 189 having the lower protrusions 189a is formed throughout the non-adhesive portion 185. However, an uneven oxide film 189 having lower protrusions 189a may be formed at only a part of a non-adhesive portion 185 as in a first modification shown in FIG. 8. In FIG. 8, a width W1 of the non-adhesive portion 185 is 1 mm, for example. The uneven oxide film 189 having the lower protrusions 189a is formed at the part of the non-adhesive portion 185 on a side near an adhesive portion 184 in a width direction and a natural oxide film 190 is formed at the rest of the non-adhesive portion 185, i.e., a part on a side near a mounting portion 182.

Second Embodiment

For the present embodiment, it is possible to refer to the preceding embodiment. Therefore, the same portions as those of the semiconductor device 10 shown in the preceding embodiment will not be described.

Figure 9:
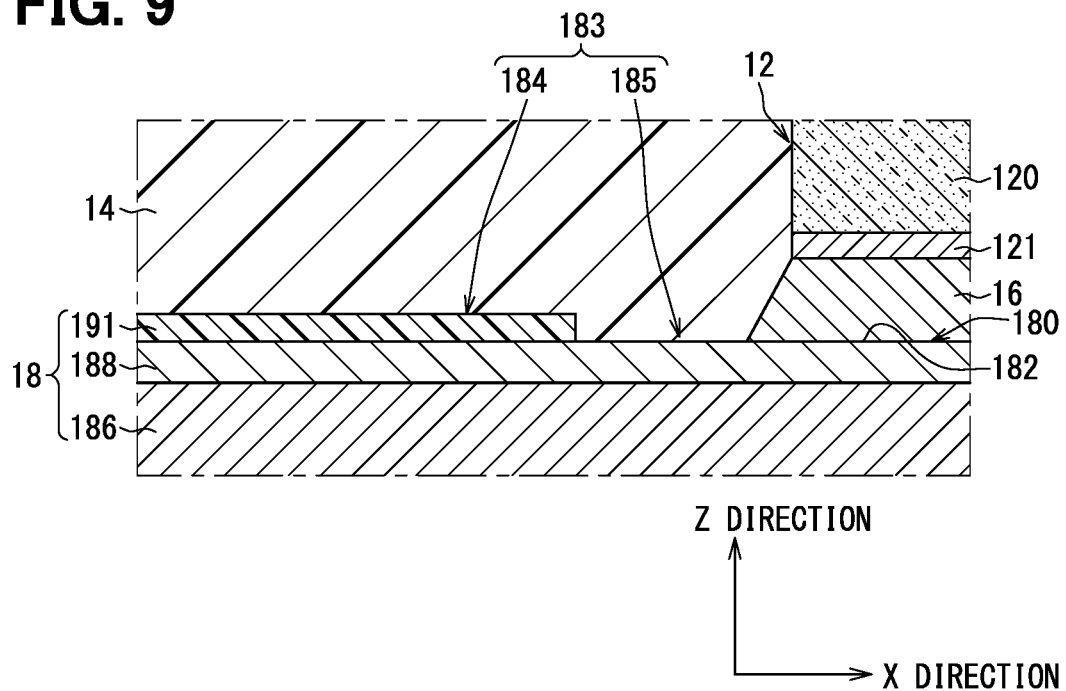
FIG. 9 is a sectional view of a schematic structure of a semiconductor device according to a second embodiment and corresponding to FIG. 4.

As shown in FIG. 9, in the present embodiment, a resin layer 191 that increases adhesion to a sealing resin body 14 is formed in an area where an adhesive portion 184 is to be formed and, as a result, the sealing resin body 14 adheres to the adhesive portion 184. The resin layer 191 formed on a metal thin film 188 is formed only at the adhesive portion 184 of a peripheral portion 183 and is not formed at a non-adhesive portion 185. As material of the resin layer 191, polyamide, polyimide, polyamide-imide, or the like can be employed. The resin layer 191 is formed by dispensing or the like. A natural oxide film (not shown) is formed on the metal thin film 188 at the non-adhesive portion 185.

In this manner, by selectively disposing the resin layer 191, the non-adhesive portion 185 is intentionally provided between a mounting portion 182 and the adhesive portion 184. In this way, the mounting portion 182 is not adjacent to the adhesive portion 184. Therefore, it is possible to reduce the thermal stress in the shear direction and acting on the interface between the end of the adhesive portion 184 near the solder 16 and the sealing resin body 14.

Third Embodiment

For the present embodiment, it is possible to refer to the preceding embodiment. Therefore, the same portions as those of the semiconductor device 10 shown in the preceding embodiment will not be described.

Figure 10:
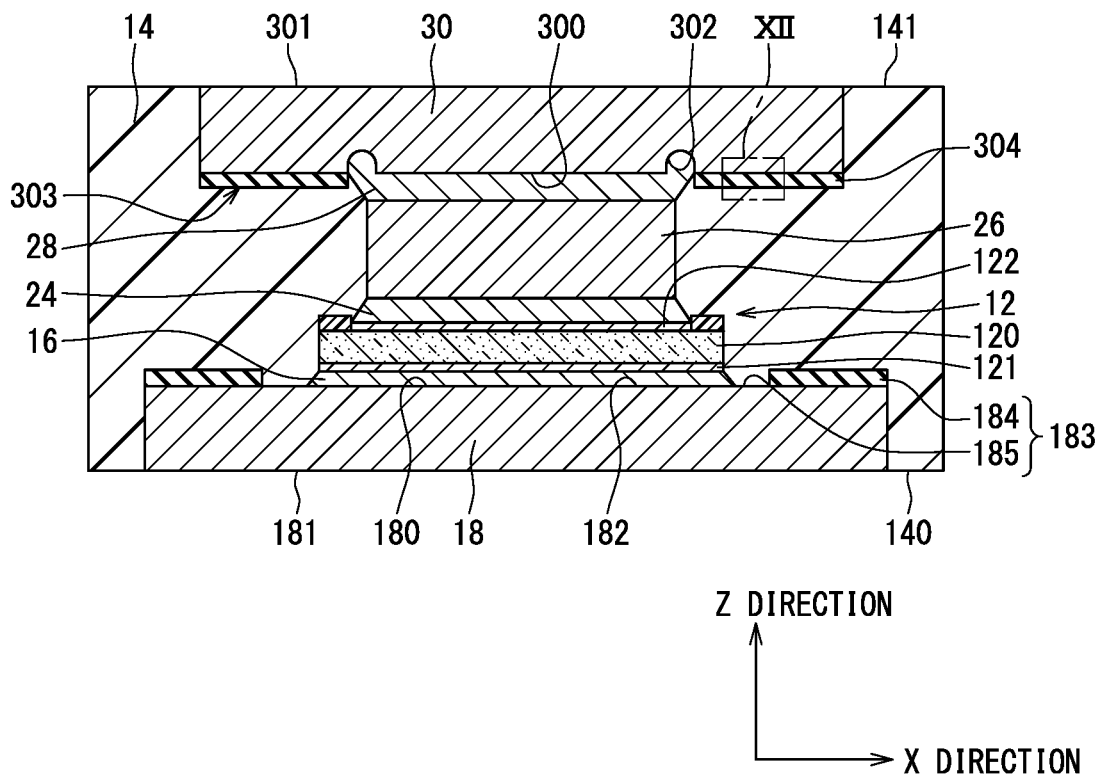
FIG. 10 is a sectional view of a schematic structure of a semiconductor device according to a third embodiment and corresponding to FIG. 2.
Figure 11:
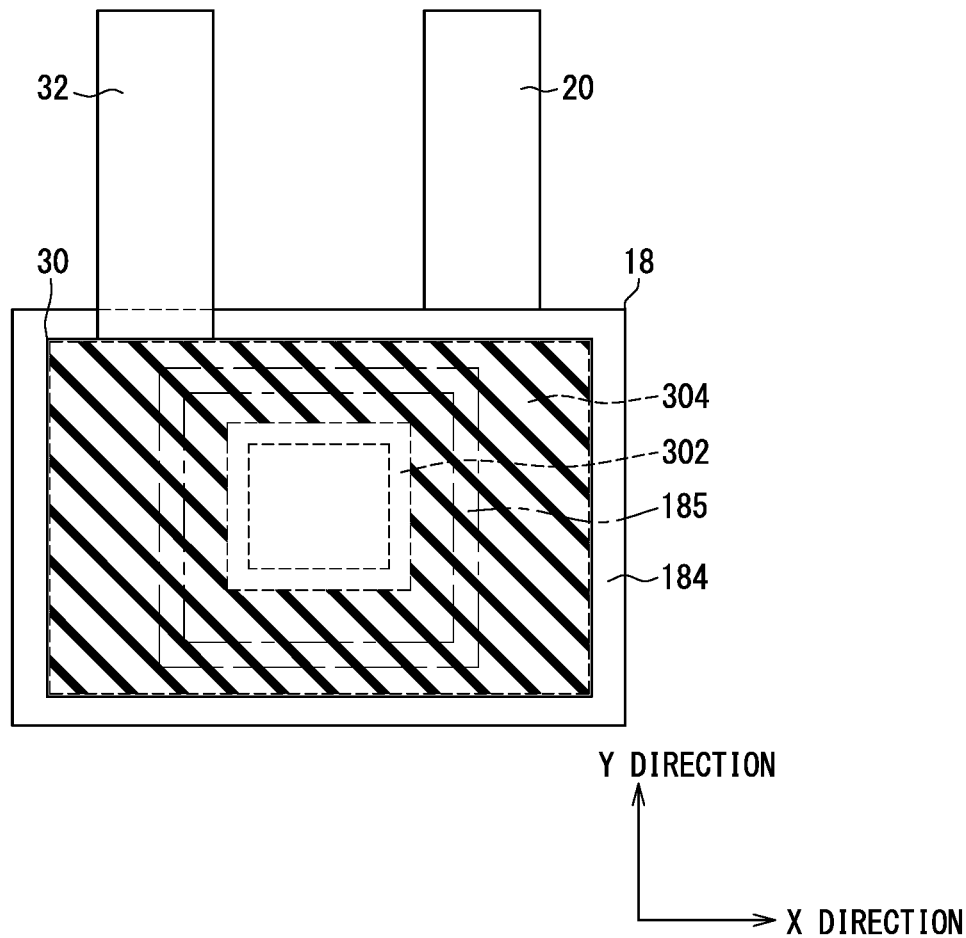
FIG. 11 is a planar layout of a non-adhesive portion and a second adhesive portion.

As shown in FIGS. 10 and 11, a second heat sink 30 in the present embodiment has an adhesive portion 304 at a peripheral portion 303 on an opposed face 300. Similarly to an adhesive portion 184 provided to the first heat sink 18, the adhesive portion 304 is a portion of the opposed face 300 to which a sealing resin body 14 adheres. In FIG. 11, a part of a semiconductor device 10, the sealing resin body 14, signal terminals 22, and the like are not shown. In FIG. 11, the adhesive portion 304 is hatched in order to clarify overlap between the non-adhesive portion 185 and the adhesive portion 304 in a plan view in a Z direction.

A portion of the opposed face 300 of the second heat sink 30 on an outer side of the groove 302 is formed as the peripheral portion 303. In the plan view in the Z direction, a portion on an inner side of an outer peripheral end of the groove 302 is a mounting portion to which solder 28 is connected. In the present embodiment, the entire peripheral portion 303 is formed as the adhesive portion 304. In the plan view in the Z direction, the adhesive portion 304 overlaps the entire non-adhesive portion 185. In other words, the entire groove 302 overlaps the mounting portion 182 on an inner side of a peripheral portion 183.

The adhesive portion 304 is formed by a roughening treatment similarly to the adhesive portion 184. In other words, the adhesive portion 304 is formed by a roughened portion. The first heat sink 18 has the same structure as in the first embodiment.

Figure 12:
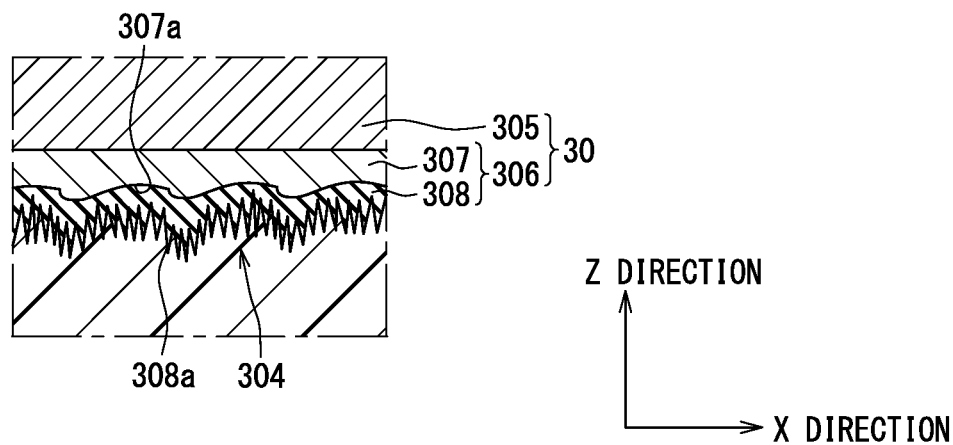
FIG. 12 is an enlarged sectional view of area XII shown by a one-dot chain line in FIG. 10.

As shown in FIG. 12, the second heat sink 30 has a base 305 made of metal material such as Cu and a film 306 provided at least on a side of the opposed face 300 of a surface of the base 305 similarly to the first heat sink 18. The base 305 has a substantially rectangular parallelepiped shape. The film 306 includes a metal thin film 307 formed on the surface of the base 305 and an uneven oxide film 308 that is an oxide of metal and has a continuously uneven surface, the metal being a main component of the metal thin film 307.

In the present embodiment, a portion of the metal thin film 307 where the uneven oxide film 308 is not formed has an electroless Ni plating film and an Au plating film formed on the electroless Ni plating film. On the other hand, a portion where the uneven oxide film 308 is formed has the electroless Ni plating film. The area of the opposed face 300 where the uneven oxide film 308 is formed does not have the Au plating film, since the Au plating film is removed by application of a laser beam and the uneven oxide film 308 is formed by using the electroless Ni plating film that is a lower layer. The metal thin film 307 is formed on a portion of the surface of the base 305 other than a back face 301.

The uneven oxide film 308 is formed similarly to the uneven oxide film 189. The uneven oxide film 308 is formed by the application of the laser beam. Specifically, the second heat sink 30 on which the electroless Ni plating film and the Au plating film on the electroless Ni plating film are formed is prepared. Under the same conditions as in the case of the uneven oxide film 189, the pulsed laser beam is applied. In this way, the uneven oxide film 308 is formed on a surface of the metal thin film 307 by melting and vaporizing a surface of the electroless Ni plating film that is the lower layer while removing the Au plating film that is an upper layer.

Since the uneven oxide film 308 is formed by use of the pulsed laser beam in this manner, multiple recesses 307a are formed in a portion of the surface of the metal thin film 307 corresponding to the adhesive portion 304 similarly to recesses 188a in a metal thin film 188. One pulse forms each of the recesses 307a. Protrusions 308a are formed on a surface of the uneven oxide film 308 similarly to the protrusions 189a.

In the present embodiment, out of the opposed face 300, the entire peripheral portion 303 is an irradiated area with the laser beam and the inner side of the outer peripheral edge of the groove 302, i.e., the entire mounting portion is an unirradiated area with the laser beam. Therefore, similarly to the non-adhesive portion 185 adjacent to the adhesive portion 184, the uneven oxide film 308 is formed at a portion adjacent to the adhesive portion 304 (e.g., a wall face of the groove 302) as well. However, the second heat sink 30 has the Au plating film as the metal thin film 307. Therefore, the solder 28 wets an inside of and spreads into the groove 302 due to an effect of Au.

In the present embodiment, the second heat sink 30 corresponds to a second conductive member and the first heat sink 18 corresponds to a first conductive member. The adhesive portion 184 corresponds to a first adhesive portion and the adhesive portion 304 corresponds to a second adhesive portion. A collector electrode 121 corresponds to a first electrode and an emitter electrode 122 corresponds to a second electrode.

Next, an example of effects of the semiconductor device 10 will be described.

Figure 13:
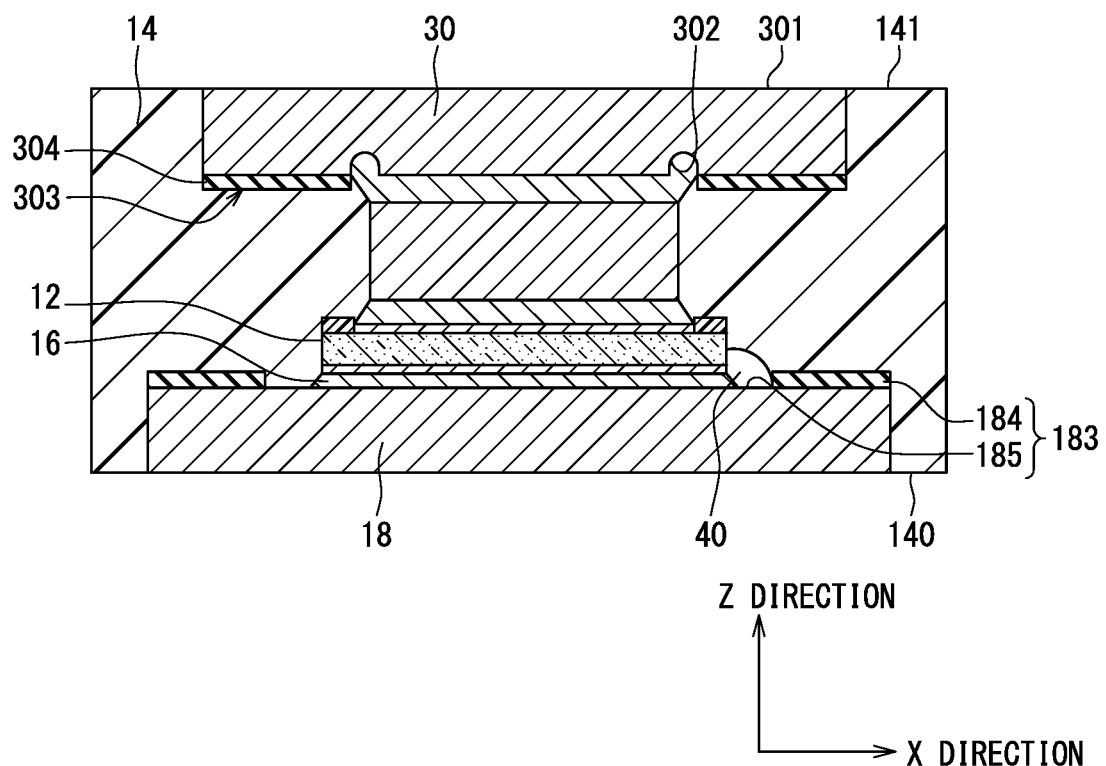
FIG. 13 is a sectional view of a void formed on the non-adhesive portion and corresponding to FIG. 10.

As shown in FIG. 13, a void 40 may be formed at a position adjacent to the non-adhesive portion 185 and solder 16 due to air trapped in molding of the sealing resin body 14, air in a resin tablet that is material of the sealing resin body 14, vaporization of absorbed moisture, and the like.

Figure 14:
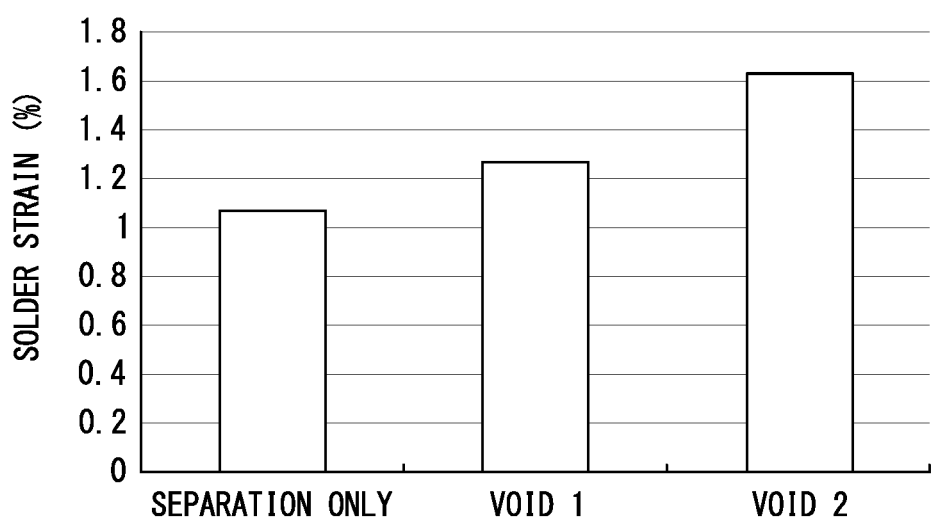
FIG. 14 is a diagram showing a relationship between presence/absence of a void and a solder strain.

FIG. 14 shows results of simulations about a relationship between presence/absence of the void 40 and a strain (plastic strain) of the solder 16. In the simulations, size of an element was 13.4 mm×15 mm, a thickness of the solder 16 was 40 μm, and a thickness of solder 24 was 150 μm. An element thickness was 0.08 mm (80 μm). The temperature of the sealing resin body 14 was changed from 180° C. to −40° C. and a solder strain (%) was obtained from a displacement of the solder 16 at −40° C. from the solder 16 at 180° C.

"SEPARATION ONLY" in FIG. 14 shows a case where the sealing resin body 14 was not adhering to the non-adhesive portion 185 and the sealing resin body 14 was separated from the non-adhesive portion 185. In other words, a void 40 was not formed in this case. On the other hand, "VOID 1" and "VOID 2" show cases where voids 40 were formed. "VOID 1" shows the case where a thickness of the void 40 was equal to the sum of a thickness of the solder 16 and a half of a thickness of the semiconductor chip 12. "VOID 2" shows the case where a thickness of the void 40 was equal to the sum of the thickness of the solder 16 and the thickness of the semiconductor chip 12.

As shown in FIG. 14, it is clear that the solder stain is larger when the void 40 is formed. Moreover, it is clear that the solder strain increases as the thickness (size) of the void 40 increases. If the solder strain increases in this manner, connection reliability of the solder 16 is degraded. Therefore, it is important to detect the presence/absence of the void 40.

Figure 15:
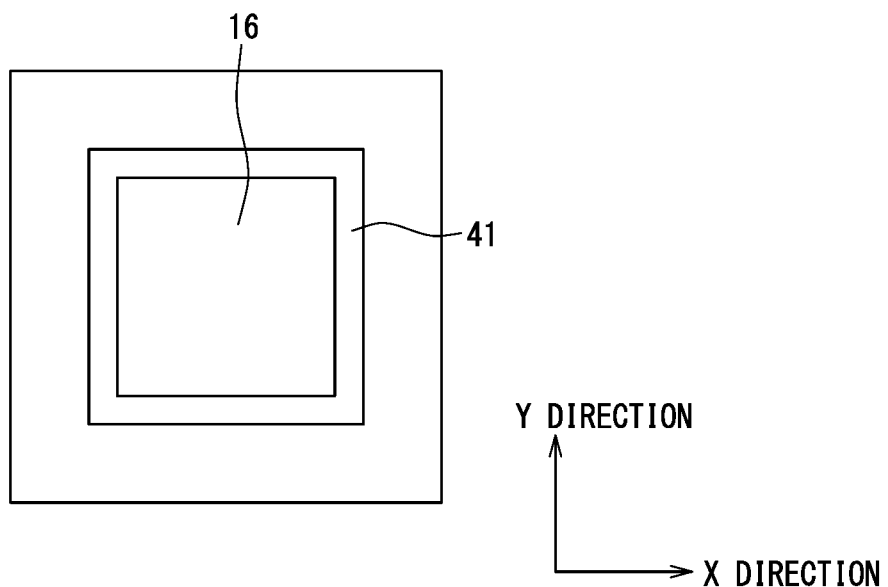
FIG. 15 is an SAT image from a side of a first heat sink.

To detect the void 40, it is possible to use a scanning acoustic tomograph (SAT). However, in trying to detect the void 40 from a side of the first heat sink 18 in the Z direction, the sealing resin body 14 is separated from the non-adhesive portion 185 in front of the void 40 and therefore an SAT image is as shown in FIG. 15. Reference sign 41 shown in FIG. 15 designates a separated portion of the sealing resin body 14 from the non-adhesive portion 185. Since the void 40 is hidden behind the separated portion 41 in this manner, it is impossible to distinguish between the void 40 and the separated portion 41. In other words, it is impossible to detect the void 40. The scanning acoustic tomograph may be referred to as an ultrasound flow detector, ultrasonic test equipment.

As described in the preceding embodiments, the sealing resin body 14 is separated from the peripheral portion 303 of the opposed face 300 in the structure not including the adhesive portion 304 provided to the opposed face 300 of the second heat sink 30. Therefore, in trying to detect the void 40 from the side of the second heat sink 30, the separated portion on the side of the second heat sink 30 exists in front of the void 40. Therefore, the void 40 is hidden behind the separated portion and it is impossible to detect the void 40.

In the present embodiment, on the other hand, the adhesive portion 304 is provided to the opposed face 300 of the second heat sink 30 and the adhesive portion 304 overlaps the non-adhesive portion 185 in the plan view in the Z direction. Since the sealing resin body 14 is adhering to the second heat sink 30 directly above the non-adhesive portion 185, a condition of an interface between the second heat sink 30 and the sealing resin body 14 does not obstruct detection of the void 40.

Figure 16:
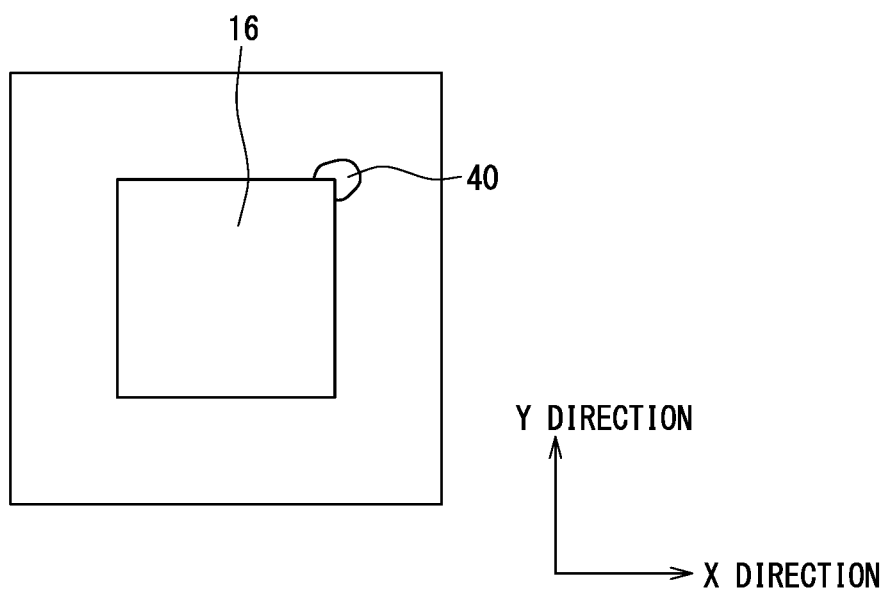
FIG. 16 is an SAT image from a side of a second heat sink.

Therefore, by adjusting the scanning depth of the scanning acoustic tomograph, it is possible to precisely detect the void 40 positioned in front of the separated portion 41. An SAT image from the side of the second heat sink 30 is as shown in FIG. 16. In this way, it is possible to increase the connection reliability of the solder 16 to thereby suppress shortening of a product's life.

Especially, in the present embodiment, the adhesive portion 304 overlaps the entire non-adhesive portion 185 in the plan view in the Z direction. Therefore, wherever the void 40 is formed at the non-adhesive portion 185, it is possible to detect the void 40.

In the present embodiment, the adhesive portion 304 is formed by the uneven oxide film 308 having the extremely fine recesses and protrusions formed on the surface. Therefore, by means of an anchoring effect and an increase in an area of contact, it is possible to cause the sealing resin body 14 to adhere. Both of the adhesive portions 184, 304 can be formed by the application of the laser beam, which simplifies a manufacturing process.

Although the entire peripheral portion 303 is formed as the adhesive portion 304 as an example, the present disclosure is not restricted to this example. The adhesive portion 304 may be formed only at a part of the peripheral portion 303 so that the adhesive portion 304 overlaps the entire non-adhesive portion 185.

Although the roughened portion having the uneven oxide film 189 is shown as an example of the adhesive portion 184 of the first heat sink 18, the adhesive portion 184 is not restricted to this example. Combination with the adhesive portion 184 having the resin layer 191 shown in the second embodiment is possible.

Fourth Embodiment

For the present embodiment, it is possible to refer to the preceding embodiment. Therefore, the same portions as those of the semiconductor device 10 shown in the preceding embodiment will not be described.

In the present embodiment, an adhesive portion 304 of a second heat sink 30 is provided so as to overlap only a part of a non-adhesive portion 185 in a plan view in a Z direction. Other structures are the same as those in the third embodiment.

Figure 17:
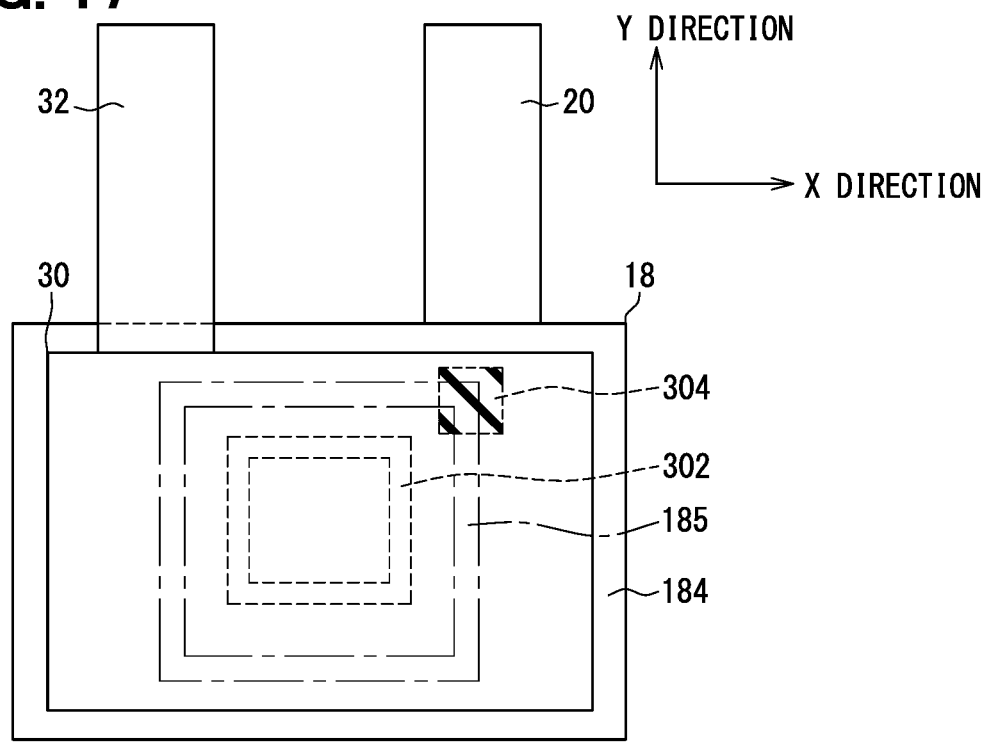
FIG. 17 is a planar layout of a non-adhesive portion and a second adhesive portion in a semiconductor device according to a fourth embodiment and corresponding to FIG. 11.

In FIG. 17, the adhesive portion 304 is provided to overlap only the part in a peripheral direction of the non-adhesive portion 185 having a rectangular ring shape in the plan view. Specifically, the adhesive portion 304 is provided to correspond to a portion of the non-adhesive portion 185 where a void 40 is likely to be formed due to a positional relationship with a gate of a mold (not shown) for molding a sealing resin body 14. In FIG. 17, the side gate is employed and the adhesive portion 304 is provided to include a farthest position from the gate on a route around a semiconductor chip 12 in the plan view in the Z direction. The adhesive portion 304 is provided to correspond to one of four corners of the non-adhesive portion 185.

It is possible to detect the void 40 on the non-adhesive portion 185 in the case as well where the adhesive portion 304 is provided to correspond to only the part of the non-adhesive portion 185. In the Z direction, it is possible to detect the void 40 directly below the adhesive portion 304.

Figure 18:
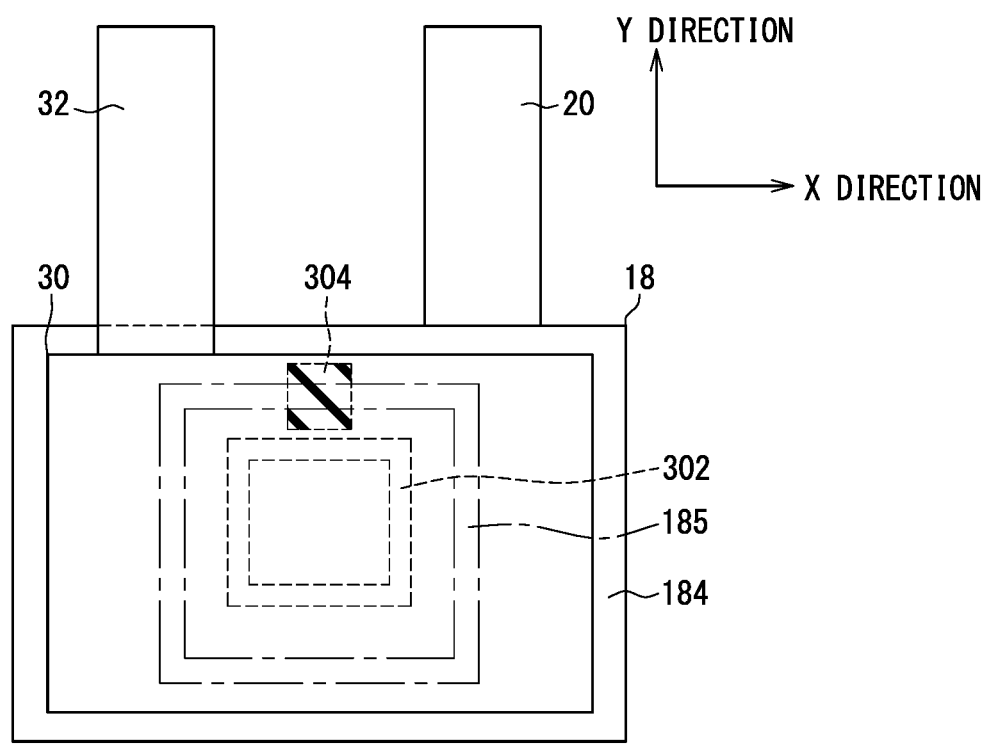
FIG. 18 is a plan view of a second modification and corresponding to FIG. 17.

The position of the adhesive portion 304 is not restricted to the example shown in FIG. 17. For example, if a center gate is employed, an adhesive portion 304 may be provided near a center of a side of a non-adhesive portion 185 having a rectangular ring shape as in a second modification shown in FIG. 18.

Figure 19:
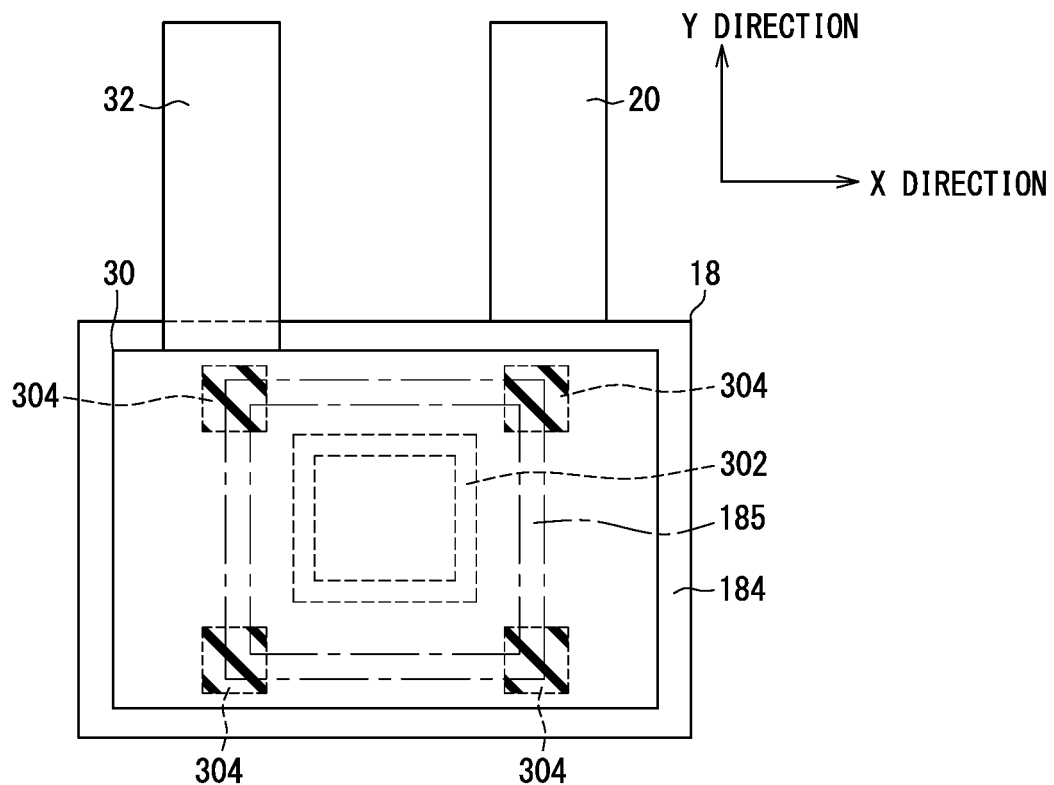
FIG. 19 is a plan view of a third modification and corresponding to FIG. 17.

As in a third modification shown in FIG. 19, adhesive portions 304 may be provided to respective four corners of a non-adhesive portion 185 having a rectangular ring shape. In this way, whichever of the four corners of the non-adhesive portion 185 a void 40 is formed at, it is possible to detect the void 40.

Figure 20:
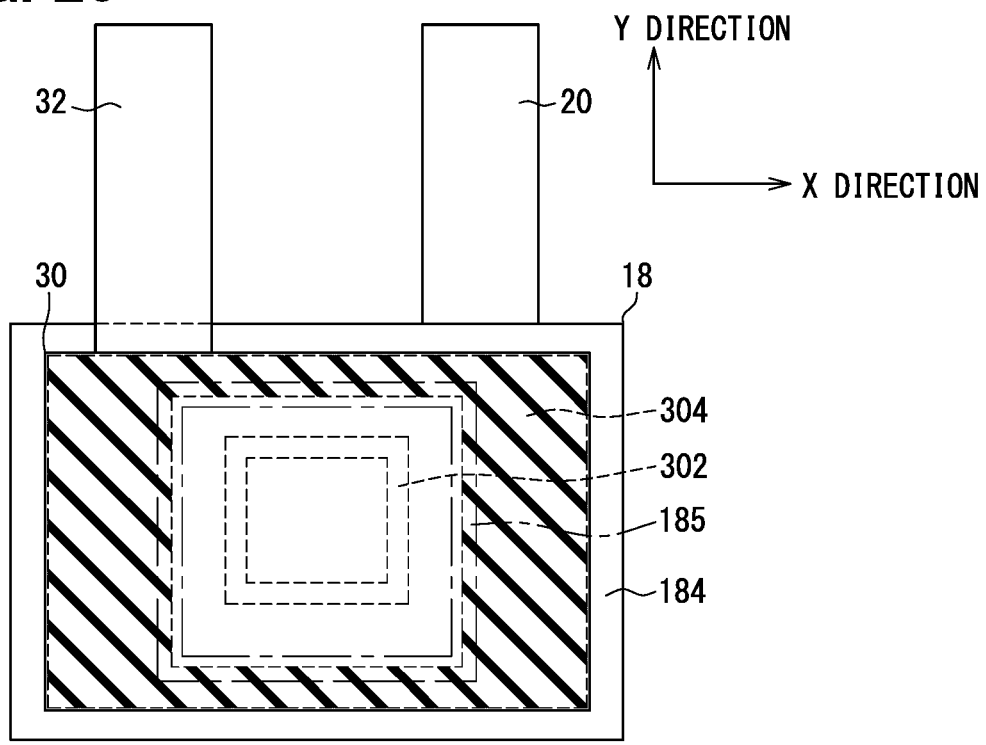
FIG. 20 is a plan view of a fourth modification and corresponding to FIG. 17.

As in a fourth modification shown in FIG. 20, an adhesive portion 304 may be provided to overlap not a part of a non-adhesive portion 185 in a peripheral direction but only a part of the non-adhesive portion 185 in a width direction.

In this case as well, it is possible to detect a void 40 directly below the adhesive portion 304 in the Z direction.

FIGS. 17 to FIG. 20 correspond to FIG. 11. In FIGS. 17 to 20, as in FIG. 11, the adhesive portion(s) 304 is/are hatched in order to clarify overlap between the non-adhesive portion 185 and the adhesive portion(s) 304.

The disclosure of the present description is not restricted to the embodiments shown as examples. The disclosure includes the embodiments shown as examples and modifications made to the embodiments by a person skilled in the art. For example, the disclosure is not restricted to the combinations of the components shown in the embodiments. The disclosure can be carried out by means of various combinations. The disclosed technical scope is not restricted to the description of the embodiments.

Although the 1-in-1 package structure including the one semiconductor chip 12 is shown as an example of the semiconductor device 10, the semiconductor device 10 is not restricted to this example. The semiconductor device 10 can be applied to a structure including two semiconductor chips 12 forming upper and lower arms for one phase or a structure including six semiconductor chips 12 forming upper and lower arms for three phases as well. In other words, the semiconductor device 10 can be applied to the 2-in-1 package structure or the 6-in-1 package structure as well.

Although the example in which the IGBT and the FWD are formed on the same semiconductor chip 12 is shown, the present disclosure is not restricted to this example. An IGBT and an FWD may be formed on separate chips.

Although the example in which the back face 181 of the first heat sink 18 and the back face 301 of the second heat sink 30 are exposed from the sealing resin body 14 is shown, the present disclosure is not restricted to this example. At least one of back faces 181, 301 may be covered with a sealing resin body 14.

Metal forming the metal thin film 188 is not restricted to Ni. In other words, the uneven oxide film 189 is not restricted to the oxide of Ni. The uneven oxide film 189 only has to be an oxide of metal forming the metal thin film 188.

Although the roughened portion formed by the application of the laser beam is shown as an example of the roughened portion forming the adhesive portion 184, the roughed portion is not restricted to this example. For example, it is possible to give roughening plating so that a sealing resin body 14 adheres only to an adhesive portion 184 and not to a non-adhesive portion 185.

Although the example in which the semiconductor device 10 includes the semiconductor chip 12, the sealing resin body 14, the solder 16, the first heat sink 18 as the conductive member, the solder 24, the terminal 26, the solder 28, and the second heat sink 30 is shown, the present disclosure is not restricted to this example. The semiconductor device only has to include: the semiconductor chip having the electrode, the conductive member including the metal base and having, on the face opposed to the electrode, the mounting portion for the semiconductor chip and the peripheral portion surrounding the mounting portion; the solder that is provided between the electrode and the mounting portion to connect the electrode and the conductive member; and the sealing resin body that integrally seals the semiconductor chip, at least the opposed face of the metal base, and the solder. The conductive member only has to include, as the peripheral portion, the adhesive portion which is provided to surround the mounting portion and to which the sealing resin body adheres and the non-adhesive portion which is provided between the mounting portion and the adhesive portion, to which the solder is not connected, and which has lower adhesion to the sealing resin body than the adhesive portion. The present disclosure is not restricted to the semiconductor device having the double-sided heat dissipation structure and can be applied to a semiconductor device having a one-sided heat dissipation structure.

Although the roughened portion formed by the application of the laser beam is shown as an example of the roughened portion forming the adhesive portion 304, the roughed portion is not restricted to this example. For example, it is possible to give roughening plating so that a sealing resin body 14 adheres to an adhesive portion 304. As described in the second embodiment, a resin layer that increases adhesion to a sealing resin body 14 may be provided to an area where an adhesive portion 304 is to be formed.

According to the semiconductor device in the present disclosure, the semiconductor chip may further include the first electrode as the electrode on the one face side in the thickness direction, the second electrode on the side of the face opposite from the one face, and the semiconductor device may further include the second conductive member disposed, so that the semiconductor chip is sandwiched between the first conductive member as the conductive member and the second conductive member in the thickness direction, and electrically connected to the second electrode. Moreover, the sealing resin body may integrally seal the face of the second conductive member opposed to the first conductive member. Furthermore, the first conductive member may include, as the peripheral portion, the first adhesive portion that is the adhesive portion and the non-adhesive portion and the second conductive member may have, on the face opposed to the first conductive member, the second adhesive portion to which the sealing resin body adheres and which is provided so as to overlap at least the part of the non-adhesive portion in the plan view in the thickness direction.

According to the semiconductor device, when a void is generated on the non-adhesive portion of the first conductive member, the void may be detected.

In the above, the embodiment, the configuration, an aspect of the semiconductor device according to the present disclosure are exemplified. However, the present disclosure is not limited to every embodiment, every configuration and every aspect related to the present disclosure are exemplified. For example, the field of the embodiment, the configuration, the aspect relate to the present disclosure includes the embodiment, the configuration, the aspect obtained by accordingly combining each technical part disclosed in different embodiment, configuration and aspect.

What is claimed is:

1. A semiconductor device comprising:
   a semiconductor chip having an electrode;
   a conductive member including a metal base and having, on a face opposed to the electrode, a mounting portion for the semiconductor chip and a peripheral portion surrounding the mounting portion;
   a solder that is provided between the electrode and the mounting portion to connect the electrode and the conductive member; and
   a sealing resin body that integrally seals the semiconductor chip, at least the face opposed to the electrode in the conductive member, and the solder,
   wherein:
   the conductive member has, as the peripheral portion, an adhesive portion and a non-adhesive portion;
   the sealing resin body adheres to the adhesive portion;

the non-adhesive portion is placed between the mounting portion and the adhesive portion;

the solder does not connect with the non-adhesive portion; and the non-adhesive portion has lower adhesion to the sealing resin body than the adhesive portion;

the adhesive portion includes a roughened portion having a continuously uneven surface;

the conductive member includes a film on a surface of the metal base;

the film is provided to an entire area of the adhesive portion and at least a part of the non-adhesive portion close to the adhesive portion; and a protrusion on the film is higher at the adhesive portion than at the non-adhesive portion.

2. The semiconductor device according to claim 1, wherein:

the semiconductor chip has
a first electrode, which is the electrode, on a first face side in a thickness direction, and
a second electrode on a second face side opposite to the first face side;

the semiconductor device further comprises a second conductive member that is disposed, causing the semiconductor chip to be sandwiched between the first conductive member as the conductive member and the second conductive member in the thickness direction, the second conductive member being electrically connected to the second electrode;

the sealing resin body integrally seals a face of the second conductive member, the face facing the first conductive member;

the first conductive member has, as the peripheral portion, the non-adhesive portion and a first adhesive portion that is the adhesive portion and; and the second conductive member has, on a face opposed to the first conductive member, a second adhesive portion to which the sealing resin body adheres and which overlaps at least a part of the non-adhesive portion in a plan view in the thickness direction.

3. The semiconductor device according to claim 2, wherein:

the second adhesive portion overlaps an entire area of the non-adhesive portion in the thickness direction.

4. The semiconductor device according to claim 2, wherein:

the second adhesive portion overlaps only a part in a peripheral direction of the non-adhesive portion surrounding the mounting portion.

5. The semiconductor device according to claim 2, wherein:

the second adhesive portion includes a roughened portion having a continuously uneven surface.

6. The semiconductor device according to claim 1, wherein:

a width of the non-adhesive portion is 0.2 mm or more.

7. The semiconductor device according to claim 1, wherein:

a width of the non-adhesive portion is 0.5 mm or less.

8. A semiconductor device comprising:

a semiconductor chip having an electrode;

a conductive member including a metal base and having, on a face opposed to the electrode, a mounting portion for the semiconductor chip and a peripheral portion surrounding the mounting portion;

a solder that is provided between the electrode and the mounting portion to connect the electrode and the conductive member; and a sealing resin body that integrally seals the semiconductor chip, at least the face opposed to the electrode in the conductive member, and the solder, wherein:

the conductive member has, as the peripheral portion, an adhesive portion and a non-adhesive portion;

the sealing resin body adheres to the adhesive portion;

the non-adhesive portion is placed between the mounting portion and the adhesive portion;

the solder does not connect with the non-adhesive portion; and the non-adhesive portion has lower adhesion to the sealing resin body than the adhesive portion;

the adhesive portion includes a roughened portion having a continuously uneven surface;

the conductive member includes a film on a surface of the metal base;

the film has a metal thin film on the surface of the metal base, and an uneven oxide film that is an oxide of metal and that has a continuously uneven surface, the metal being a main component of the metal thin film; and the uneven oxide film is provided to an entire area of the adhesive portion and at least a part of the non-adhesive portion close to the adhesive portion.

9. The semiconductor device according to claim 8, wherein:

a protrusion on the uneven oxide film is higher at the adhesive portion than at the non-adhesive portion.

10. The semiconductor device according to claim 8, wherein:

the semiconductor chip has
a first electrode, which is the electrode, on a first face side in a thickness direction, and
a second electrode on a second face side opposite to the first face side;

the semiconductor device further comprises a second conductive member that is disposed, causing the semiconductor chip to be sandwiched between the first conductive member as the conductive member and the second conductive member in the thickness direction, the second conductive member being electrically connected to the second electrode;

the sealing resin body integrally seals a face of the second conductive member, the face facing the first conductive member;

the first conductive member has, as the peripheral portion, the non-adhesive portion and a first adhesive portion that is the adhesive portion and; and the second conductive member has, on a face opposed to the first conductive member, a second adhesive portion to which the sealing resin body adheres and which overlaps at least a part of the non-adhesive portion in a plan view in the thickness direction.

11. The semiconductor device according to claim 10, wherein:

the second adhesive portion overlaps an entire area of the non-adhesive portion in the thickness direction.

12. The semiconductor device according to claim 10, wherein:

the second adhesive portion overlaps only a part in a peripheral direction of the non-adhesive portion surrounding the mounting portion.

13. The semiconductor device according to claim 10, wherein:

the second adhesive portion includes a roughened portion having a continuously uneven surface.

14. The semiconductor device according to claim 8, wherein:
a width of the non-adhesive portion is 0.2 mm or more.

15. The semiconductor device according to claim 8, wherein:
a width of the non-adhesive portion is 0.5 mm or less.

16. A semiconductor device comprising:
a semiconductor chip having an electrode;
a conductive member including a metal base and having, on a face opposed to the electrode, a mounting portion for the semiconductor chip and a peripheral portion surrounding the mounting portion;
a solder that is provided between the electrode and the mounting portion to connect the electrode and the conductive member; and
a sealing resin body that integrally seals the semiconductor chip, at least the face opposed to the electrode in the conductive member, and the solder,
wherein:
the conductive member has, as the peripheral portion, an adhesive portion and a non-adhesive portion;
the sealing resin body adheres to the adhesive portion;
the non-adhesive portion is placed between the mounting portion and the adhesive portion;
the solder does not connect with the non-adhesive portion;
the non-adhesive portion has lower adhesion to the sealing resin body than the adhesive portion;
only at the adhesive portion of the peripheral portion includes a resin layer to increase the adhesion to the sealing resin body;
the semiconductor chip has
a first electrode, which is the electrode, on a first face side in a thickness direction, and
a second electrode on a second face side opposite to the first face side;
the semiconductor device further comprises a second conductive member that is disposed, causing the semiconductor chip to be sandwiched between the first conductive member as the conductive member and the second conductive member in the thickness direction, the second conductive member being electrically connected to the second electrode;
the sealing resin body integrally seals a face of the second conductive member, the face facing the first conductive member;
the first conductive member has, as the peripheral portion, the non-adhesive portion and a first adhesive portion that is the adhesive portion and; and
the second conductive member has, on a face opposed to the first conductive member, a second adhesive portion to which the sealing resin body adheres and which overlaps at least a part of the non-adhesive portion in a plan view in the thickness direction.

17. The semiconductor device according to claim 16, wherein:
the second adhesive portion overlaps an entire area of the non-adhesive portion in the thickness direction.

18. The semiconductor device according to claim 16, wherein:
the second adhesive portion overlaps only a part in a peripheral direction of the non-adhesive portion surrounding the mounting portion.

19. The semiconductor device according to claim 16, wherein:
the second adhesive portion includes a roughened portion having a continuously uneven surface.

20. The semiconductor device according to claim 16, wherein:
a width of the non-adhesive portion is 0.2 mm or more.

21. The semiconductor device according to claim 16, wherein:
a width of the non-adhesive portion is 0.5 mm or less.

22. A semiconductor device comprising:
a semiconductor chip having an electrode;
a conductive member including a metal base and having, on a face opposed to the electrode, a mounting portion for the semiconductor chip and a peripheral portion surrounding the mounting portion;
a solder that is provided between the electrode and the mounting portion to connect the electrode and the conductive member; and
a sealing resin body that integrally seals the semiconductor chip, at least the face opposed to the electrode in the conductive member, and the solder,
wherein:
the conductive member has, as the peripheral portion, an adhesive portion and a non-adhesive portion;
the sealing resin body adheres to the adhesive portion;
the non-adhesive portion is placed between the mounting portion and the adhesive portion;
the solder does not connect with the non-adhesive portion;
the non-adhesive portion has lower adhesion to the sealing resin body than the adhesive portion;
the semiconductor chip has
a first electrode, which is the electrode, on a first face side in a thickness direction, and
a second electrode on a second face side opposite to the first face side;
the semiconductor device further comprises a second conductive member that is disposed, causing the semiconductor chip to be sandwiched between the first conductive member as the conductive member and the second conductive member in the thickness direction, the second conductive member being electrically connected to the second electrode;
the sealing resin body integrally seals a face of the second conductive member, the face facing the first conductive member;
the first conductive member has, as the peripheral portion, the non-adhesive portion and a first adhesive portion that is the adhesive portion and; and
the second conductive member has, on a face opposed to the first conductive member, a second adhesive portion to which the sealing resin body adheres and which overlaps at least a part of the non-adhesive portion in a plan view in the thickness direction.

23. The semiconductor device according to claim 22, wherein:
the first adhesive portion includes a roughened portion having a continuously uneven surface.

24. The semiconductor device according to claim 23, wherein:
the conductive member includes a film on a surface of the metal base;
the film has a metal thin film on the surface of the metal base, and an uneven oxide film that is an oxide of metal and that has a continuously uneven surface, the metal being a main component of the metal thin film;
the uneven oxide film is provided to an entire area of the first adhesive portion and at least a part of the non-adhesive portion close to the first adhesive portion; and a protrusion on the uneven oxide film is higher at the first adhesive portion than at the non-adhesive portion.

25. The semiconductor device according to claim 22, wherein:
the second adhesive portion overlaps an entire area of the non-adhesive portion in the thickness direction.

26. The semiconductor device according to claim 22, wherein:
the second adhesive portion overlaps only a part in a peripheral direction of the non-adhesive portion surrounding the mounting portion.

27. The semiconductor device according to claim 22, wherein:
the second adhesive portion includes a roughened portion having a continuously uneven surface.

28. The semiconductor device according to claim 22, wherein:
a width of the non-adhesive portion is 0.2 mm or more.

29. The semiconductor device according to claim 22, wherein:
a width of the non-adhesive portion is 0.5 mm or less.

30. The semiconductor device according to claim 8, wherein
only the adhesive portion of the peripheral portion includes a resin layer to increase the adhesion to the sealing resin body.

* * * * *